US009831375B2

(12) United States Patent
Heibel et al.

(10) Patent No.: US 9,831,375 B2
(45) Date of Patent: Nov. 28, 2017

(54) SOLID STATE RADIATION DETECTOR WITH ENHANCED GAMMA RADIATION SENSITIVITY

(71) Applicant: Westinghouse Electric Company LLC, Cranberry Township, PA (US)

(72) Inventors: Michael D. Heibel, Harrison City, PA (US); Melissa M. Walter, Butler, PA (US); Robert W. Flammang, Pittsburgh, PA (US)

(73) Assignee: Westinghouse Electric Company LLC, Cranberry Township, PA (US)

( * ) Notice: Subject to any disclaimer, the term of this patent is extended or adjusted under 35 U.S.C. 154(b) by 962 days.

(21) Appl. No.: 13/769,401

(22) Filed: Feb. 18, 2013

(65) Prior Publication Data
US 2013/0285068 A1 Oct. 31, 2013

Related U.S. Application Data

(60) Provisional application No. 61/637,994, filed on Apr. 25, 2012.

(51) Int. Cl.
*H01L 31/118* (2006.01)
*G01T 1/24* (2006.01)
*H01L 31/108* (2006.01)

(52) U.S. Cl.
CPC ........... *H01L 31/118* (2013.01); *G01T 1/24* (2013.01); *H01L 31/108* (2013.01)

(58) Field of Classification Search
CPC combination set(s) only.
See application file for complete search history.

(56) References Cited

U.S. PATENT DOCUMENTS

| 5,726,453 | A | 3/1998 | Lott et al. |
| 5,745,538 | A | 4/1998 | Heibel |
| 5,940,460 | A | 8/1999 | Seidel et al. |
| 5,969,359 | A * | 10/1999 | Ruddy et al. ............ 250/370.05 |
| 6,061,412 | A | 5/2000 | Stucker et al. |
| 2004/0178426 | A1 | 9/2004 | Melekhov et al. |
| 2007/0235655 | A1 | 10/2007 | Rhiger et al. |
| 2007/0290135 | A1 | 12/2007 | Manivannan et al. |
| 2010/0219385 | A1 * | 9/2010 | Miller ........................... 252/636 |
| 2011/0042575 | A1 | 2/2011 | Ishii et al. |
| 2011/0284755 | A1 | 11/2011 | Stradins et al. |

FOREIGN PATENT DOCUMENTS

WO WO02/14904 2/2002

OTHER PUBLICATIONS

Westinghouse Electric Company LLC, PCT International Search Report PCT/US2013/035353, dated Feb. 10, 2014, 2 pages.
Written Opinion of the International Searching Authority for PCT/US2013/035353 dated Feb. 10, 2014 (Form PCT/ISA/237).
International Preliminary Report on Patentability for PCT/US2013/035353 dated Nov. 6, 2014 (Forms PCT/IB/326, PCT/IB/373, PCT/ISA/237).

* cited by examiner

*Primary Examiner* — Kyoung Lee
*Assistant Examiner* — Ratisha Mehta
(74) *Attorney, Agent, or Firm* — Joseph C. Spadacene; Westinghouse Electric Company LLC

(57) ABSTRACT

A silicon carbide Schottky diode solid state radiation detector that has an electron donor layer such as platinum placed over and spaced above the Schottky contact to contribute high energy Compton and photoelectrical electrons from the platinum layer to the active region of the detector to enhance charged particle collection from incident gamma radiation.

10 Claims, 1 Drawing Sheet

SOLID STATE RADIATION DETECTOR WITH ENHANCED GAMMA RADIATION SENSITIVITY

CROSS REFERENCE TO RELATED APPLICATION

This application claims priority under 35 U.S.C. §119(e) from Provisional Application Ser. No. 61/637,994, entitled "Silicon Carbide Radiation Detector With Enhanced Gamma Radiation," filed Apr. 25, 2012.

BACKGROUND

1. Field

The present invention relates to radiation detectors, and more particularly relates to a solid state radiation detector with improved gamma radiation sensitivity.

2. Related Art

Conventional neutron detectors typically include devices which operate as ionization chambers or proportional counters, both of which use a neutron active gas such as $BF_3$ or He. Upon absorption of neutrons, such gases release energetic reaction particles. These particles produce ionizations in the surrounding gas which are detected by appropriately biased electrodes. Other detectors coat the walls of the ionization chamber with a solid neutron active material such as $^6Li$, $^{10}B$ or $^{235}U$. These materials also absorb neutrons and release particles which produce ionizations.

More recently, solid state neutron detectors have been employed that detect electron-hole pairs that cross a semiconductor junction. The electron-hole pairs are produced by reaction particles formed as a result of neutron absorptions within films or dopants of neutron active material incorporated within the detector. The use of silicon carbide (SiC) Schottky diodes as a solid state radiation detector for the measurement of charged particle ionizing radiation is also known to provide benefits over other types of radiation detectors (e.g., ion chambers GeLi detectors, etc.), particularly in high temperature and high gamma radiation environments. Since the silicon carbide detectors are very small, they can be installed or inserted into areas where other detector types would not fit. While the current embodiments of silicon carbide detectors will produce a signal proportional to incident gamma radiation, the signal response is very small relative to the response to charge particle impingement on the active region of the device.

There are applications where the intensity and energy spectrum of a gamma radiation field in a high temperature or limited access area are of importance. An example of this situation is the radiation surveillance needed to characterize the radiation fields surrounding and inside the damaged reactors at the Fukushima site. This invention provides an improved silicon carbide radiation detector design, capable of all the current benefits associated with Schottky diode solid state radiation detectors, that includes a modification that enhances the ability of the detector to detect and characterize the energy of the incident gamma radiation from the radioactive isotopes most important in nuclear power generation.

SUMMARY

The improvement in gamma radiation sensitivity is achieved employing a Schottky diode having an active semiconductor region and a Schottky contact over at least a portion of the active semiconductor region. A layer of Compton and photoelectron source material that reacts with incident gamma radiation to interact with electrons surrounding source atoms of the source material to produce high energy Compton and photoelectric electrons to penetrate the active region, the layer of the Compton and photoelectron source material being supported above the Schottky contact with a controllable variable distance gap filled with a low effective atomic number fluid with negligible conductance, such as air, interposed between the source material and the Schottky contact surface. The composition of the fluid gap and distance of the source layer from the Schottky contact surface is adjusted as necessary to achieve the maximum charge deposition rate in the active region of the detector for the particular gamma radiation energy being sought to be detected. This device, used by one skilled in the art of radiation detection and measurement, will allow the user to determine the distribution and relative quantity of a particular radioisotope, such as an isotope unique to fission fragments in a nuclear reactor.

Preferably, the Compton and photoelectron source material is selected from platinum or another source material having an atomic number similar to or higher than platinum that will produce electrons that will penetrate and produce ionizations in the active region of the detector. Desirably, the Schottky contact is located above the active region which comprises silicon carbide, and the thickness of the layer of the Compton and photoelectron source material and the material used in the gap is determined by use of gamma radiation transport methods, such as those available in the code package MCNP (licensable from Los Alamos National Security, LLC, Los Alamos National Laboratory), to maximize the number of photoelectrons directed towards the Schottky contact that will deposit their energy in the active region of the detector.

In one embodiment, the solid state radiation detector has a charge deposited on the active semiconductor region over a given time that is proportional to the energy of the gamma radiation incident upon the layer of the Compton and electron source material and the output of the detector is representative of both the energy and intensity of the gamma radiation incident upon the detector. Preferably, the gap between the source layer and the thickness of the gap layer controls the sensitivity of the detector to the energy of the incident radiation detected. Preferably, the thickness of the gap layer is adjustable to vary the sensitivity of the detector.

BRIEF DESCRIPTION OF THE DRAWINGS

A further understanding of the invention can be gained from the following description of the preferred embodiments when read in conjunction with the accompanying drawings in which.

DESCRIPTION OF THE PREFERRED EMBODIMENT

As previously mentioned, the use of silicon carbide Schottky diodes as a solid state radiation detector for the measurement of charged particle ionizing radiation has long been known to provide benefits over other types of radiation detectors, particularly in high temperature and high gamma radiation environments. Also, since the silicon carbide detectors are very small, they can be installed or inserted in areas where other detector types would not fit. While current embodiments of silicon carbide detectors will produce a signal proportional to incident gamma radiation, the signal response is very small relative to the response to charged particle impingement onto the active region of the device.

Figure 1:
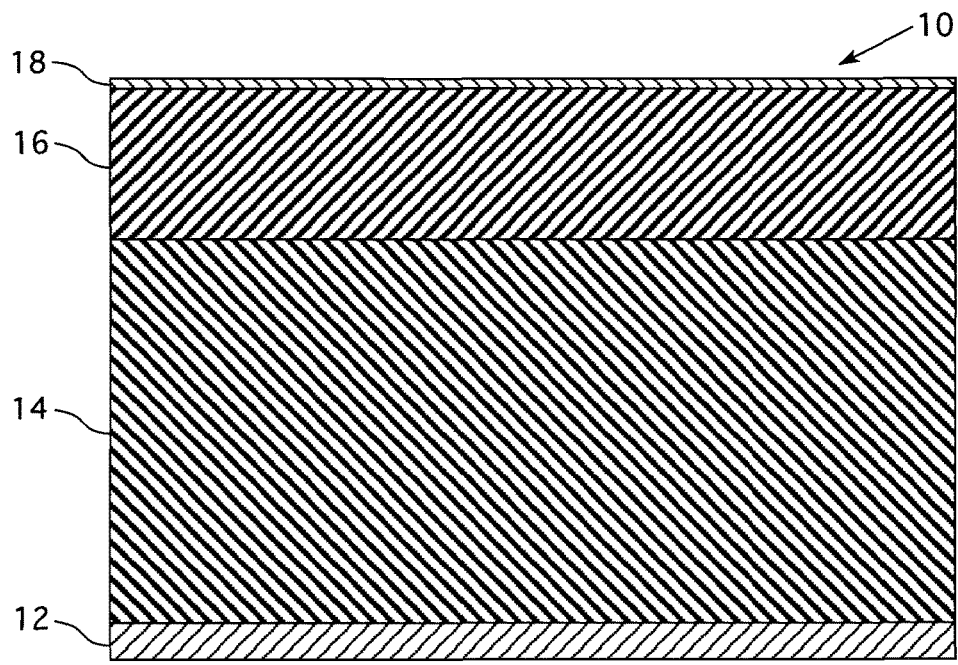
FIG. 1 is a schematic representation of a prior art silicon carbide Schottky diode radiation detector.

An exemplary prior art Schottky radiation detector 10 is shown schematically in FIG. 1. A back Ohmic contact 12 is formed on one side of a silicon carbide conducting substrate 14. The silicon carbide conducting substrate 14 is approximately 300 microns in thickness and is covered at its opposite end by a layer of epitaxial silicon carbide 16 of approximately from 3 to 100 microns in thickness. The epitaxial silicon carbide layer 16 forms the active region of the detector and is covered at its opposite end by a Schottky contact 18 which can be formed from any highly conductive metal such as platinum or gold. A reverse bias depletes n in the active region 16 and ionizing radiation produces electron-hole pairs in the depleted region. The charge is collected under the influence of an applied voltage across the contacts.

Figure 2:
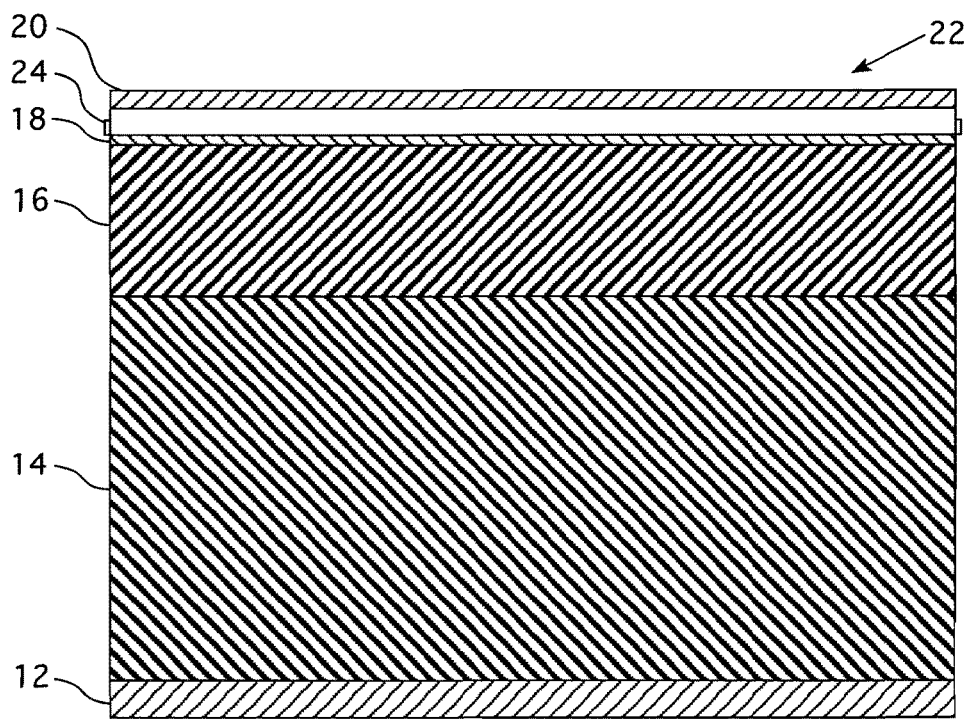
FIG. 2 is a schematic representation of a silicon carbide Schottky diode radiation detector with a platinum layer added above the Schottky contact to enhance gamma radiation generated electron deposition in the depleted layer region of the detector.

In accordance with one embodiment of this invention, enhanced gamma radiation sensitivity can be achieved over that experienced employing the prior art Schottky diode radiation detector illustrated in FIG. 1, by applying a thin layer of a Compton and photoelectron source material such as platinum, or other suitable high atomic donor material that will, in response to incident gamma radiation, release electrons that will penetrate the active region and contribute to the collection of charged particles in the active region 14. The thin layer of Compton and photoelectron source material 20, such as platinum, is placed above the outer surface of the active region above the Schottky contact 18 as shown in FIG. 2. The distance between the Schottky contact and added source layer 20 is adjustable, and preferably includes a fluid 24 with a low effective atomic number and negligible conductance, such as the properties of air at 1 atmosphere of pressure with a relative humidity less than or equal to 20 percent at 70° F. (21° C.), between the electron donor layer 20 and the Schottky contact 18. The distance between the Schottky contact 18 and the added source layer 20 is adjustable and the material used and the thickness of the source layer is selected based upon the energy range of the gamma radiation that is targeted to be detected by the user. The addition of an adjustable electron donor layer (symbolically represented by a telescoping sleeve surrounding the layer 24), i.e., adjustable in thickness and distance from the Schottky contact, allows the gamma radiation to interact with the electrons surrounding the source atoms in the donor material to produce high energy Compton and photoelectrical electrons inside the donor layer that penetrate into the active region of the silicon carbide device. The thickness of the intervening fluid 24 between the platinum layer and the Schottky contact controls the energy of the donor electrons so that they are collected in the active region. These features will produce a much higher charged deposition in the active region of detector then is possible without the high energy Compton and photoelectric electrons contributed by the donor layer 20. The charge deposited over a fixed amount of time will be proportional to the energy of the gamma radiation incident upon the layer 20, so both gamma energy and gamma radiation intensity can be determined from the proper analysis of the electrical outputs from the silicon carbide device.

Thus, the device claimed hereafter, one embodiment 22 of which was described with regard to FIG. 2, will have all the advantages of the standard silicon carbide radiation detector but will be much more sensitive to user defined spectrum of gamma radiation and energy. This will allow the range of use of this instrument to increase relative to current designs. This device will be more useful in the detection of the radiation that causes the most concern in nuclear power facilities, both during normal operations and post accident conditions. This detector will allow the user to target gamma energy released by specific isotopes of interest or concern. The small sizes possible with these devices make them ideal for applications where a detector must be inserted through a small space into an environmentally or physically hostile environment. This detector design will enhance the ability to perform spent fuel monitoring and other post operating surveillances on spent fuel by allowing the intensity of specific fission product isotope gamma radiation to be measured while the fuel is in the spent fuel pool or other more permanent storage locations. This will allow the determination of the quantities of special nuclear materials contained within the fuel and the surrounding the post accident environment.

While specific embodiments of the invention have been described in detail, it will be appreciated by those skilled in the art that various modifications and alternatives to those details could be developed in light of the overall teachings of the disclosure. Accordingly, the particular embodiments disclosed are meant to be illustrative only and not limiting as to the scope of the invention which is to be given the full breadth of the appended claims and any and all equivalents thereof.

What is claimed is:

1. A solid state radiation detector comprising:
   a Schottky diode having an active semiconductor region and a Schottky contact over at least a portion of the active semiconductor region;
   a layer of a Compton and photoelectron source material that reacts with incident gamma radiation to interact with electrons surrounding source atoms of the source material to produce high energy Compton and photoelectric electrons to penetrate into the active region of the Schottky diode through the Schottky contact, the layer of the Compton and photoelectron source material being supported above the Schottky contact; and
   a layer of fluid interposed between the Schottky contact and the layer of the Compton and photoelectron source material.

2. The solid state radiation detector of claim 1 wherein the Compton and photoelectron source material is selected from platinum, or other materials with atomic numbers substantially equal to or greater than platinum.

3. The solid state radiation detector of claim 2 wherein the Compton and photoelectron source material is platinum.

4. The solid state radiation detector of claim 1 wherein a Schottky contact is layered on top of the active region which comprises silicon carbide.

5. The solid state radiation detector of claim 1 wherein a thickness of the layer of the Compton and photoelectron source material is determined using a gamma radiation transport method to enhance a number of photoelectrons from the desired incident gamma radiation energy to deposit their energy in the active region of the Schottky diode.

6. The solid state radiation detector of claim 1 wherein the thickness of the layer of fluid is user variable.

7. The solid state radiation detector of claim 1 wherein the charge deposited over a given time on the active semiconductor region is proportional to an energy of gamma radiation incident upon the layer of the Compton and photoelectron source material and including an electrical output representative of both the gamma energy and an intensity of the gamma radiation.

8. The solid state radiation detector of claim 1 wherein the fluid in the gap between the Compton and photoelectron source material layer and the Schottky contact is comprised of air or another material with an effective atomic number and conductivity substantially equal to or less than air.

9. The solid state radiation detector of claim 1 wherein the thickness of the fluid in the gap controls the sensitivity of the detector to the energy of the radiation detected.

10. The solid state radiation detector of claim 9 wherein the thickness of the fluid in the gap between the Compton and photoelectron source material layer and the Schottky contact is adjustable to vary the sensitivity of the detector.

\* \* \* \* \*